(12) United States Patent
Saeki

(10) Patent No.: US 6,483,127 B2
(45) Date of Patent: Nov. 19, 2002

(54) SEMICONDUCTOR LIGHT EMITTING DEVICE

(75) Inventor: Ryo Saeki, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 88 days.

(21) Appl. No.: 09/781,145

(22) Filed: Feb. 8, 2001

(65) Prior Publication Data

US 2001/0011730 A1 Aug. 9, 2001

(30) Foreign Application Priority Data

Feb. 8, 2000 (JP) ........................................ 2000-030551

(51) Int. Cl.⁷ ............................................... H01L 33/00
(52) U.S. Cl. ............................. 257/96; 257/103; 372/46
(58) Field of Search ............................. 257/13, 94, 96, 257/97, 103; 372/45, 46

(56) References Cited

U.S. PATENT DOCUMENTS 5,115,441 A * 5/1992 Kopf et al. .................. 372/45
5,459,746 A * 10/1995 Itaya et al. .................. 372/46
6,350,997 B1   2/2002 Saeki

OTHER PUBLICATIONS

IEEE Photonics Technology Letters, vol. 6, No. 3, p. 313–316; "Efficient Room–Temperature Continuous–Wave AlGaInP/AlGaAs Visible (670 nm) Vertical–Cavity Surface–Emitting Laser Diodes" Schneider, et al.

"An All Phosphide 625 nm Surface Emitting Resonant Cavity LED" NAJDA, et al.
Electronics Letters vol. 33, p. 1989–1990; "Oxide–confined resonant cavity red light–emitting diode grown by solid source molecular eam epitaxy" Jalonen, et al.

\* cited by examiner

Primary Examiner—Sara Crane
(74) Attorney, Agent, or Firm—Hogan & Hartson, LLP

(57) ABSTRACT

A semiconductor light emitting device has a substrate made of a semiconductor of a first conductivity-type, a first light reflecting layer made of a semiconductor of the first conductivity-type and provided on a main surface of the substrate, an active layer made of a semiconductor including InGaAlP and provided on the first reflecting layer, a second light reflecting layer made of a semiconductor of a second conductivity-type and provided on the active layer, a current blocking layer having an opening, only through the opening a current flowing into the active layer, a transparent electrode provided on the second light reflecting layer, a front surface electrode provided on the transparent electrode and having an opening through which emission from the active layer is extracted; and a rear surface electrode provided on a rear surface of the substrate. The current supplied by the transparent electrode located under the opening of the front surface electrode and flowing into the active layer through the opening of the current blocking layer causes the active layer to emit light, the light being reflected repeatedly between the first and the second light reflecting layers and extracted via the transparent electrode under the opening of the front surface electrode.

23 Claims, 8 Drawing Sheets

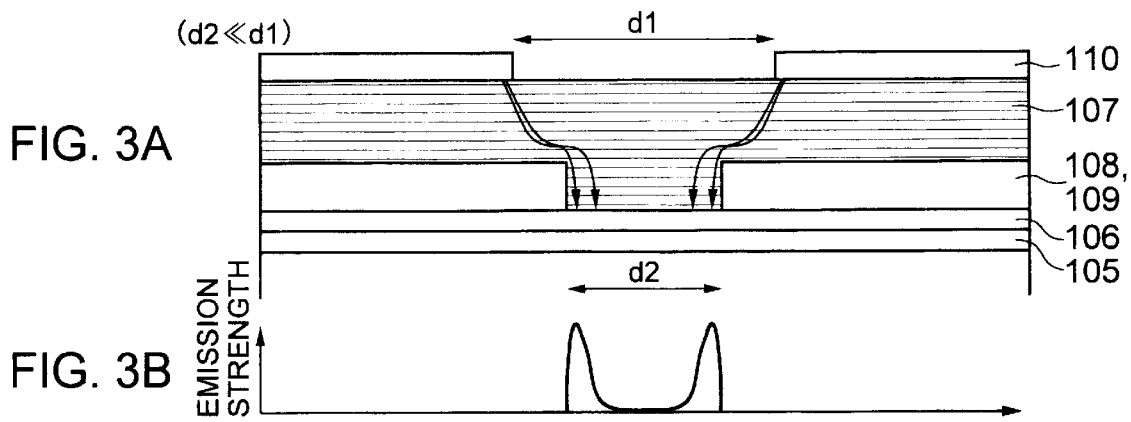
FIG. 3A
FIG. 3B
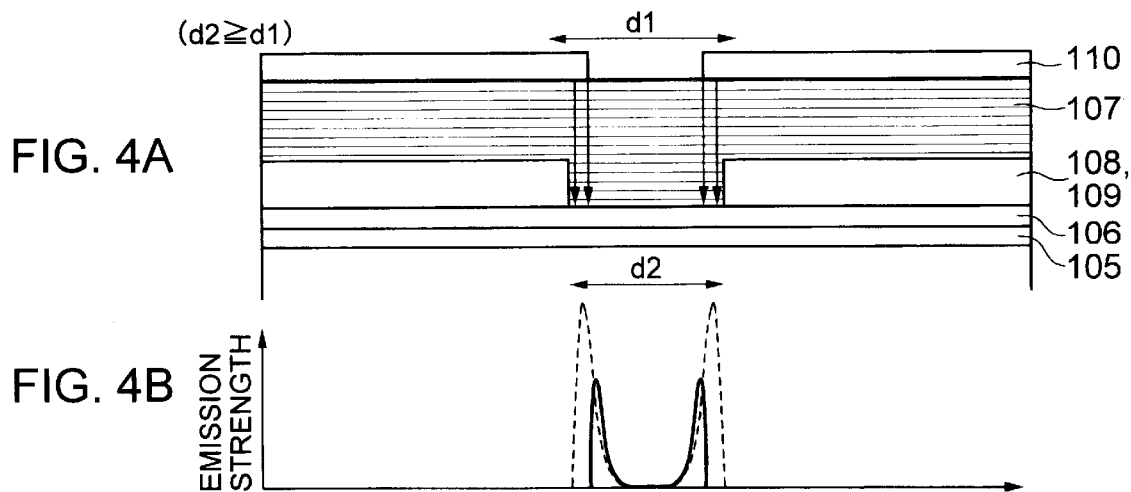
FIG. 4A
FIG. 4B
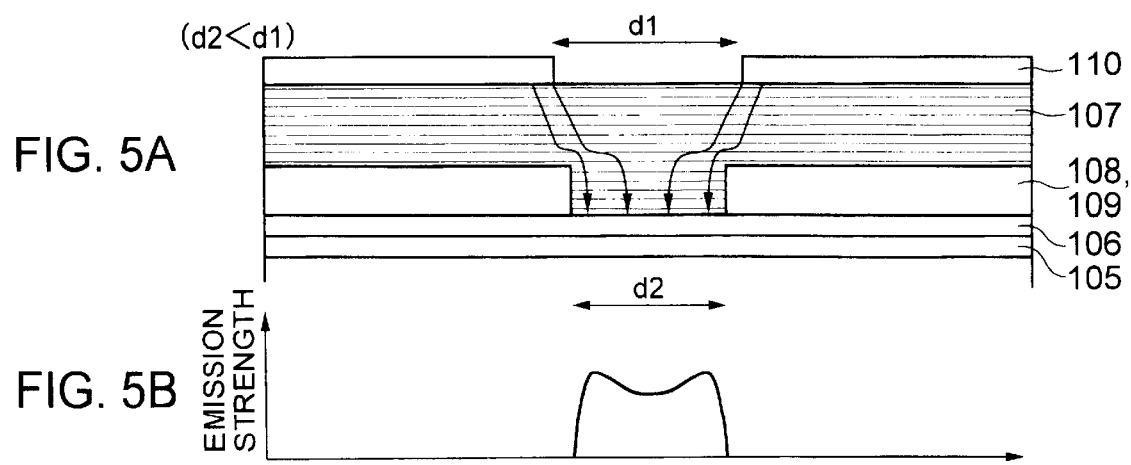
FIG. 5A
FIG. 5B

SEMICONDUCTOR LIGHT EMITTING DEVICE

CROSS REFERENCE TO RELATED APPLICATIONS

This application claims benefit of priority under 35USC §119 to Japanese Patent Application No. 2000-30551 filed on Feb. 8, 2000 in Japan, the entire contents of which are incorporated by reference herein.

BACKGROUND OF THE INVENTION

The present invention relates to a semiconductor light emitting device. Particularly, this invention relates to a structure of an InGaAlP-included semiconductor light emitting device, such as, a surface emission-type semiconductor light emitting device, suitable for optical linking devices.

Surface emission-type semiconductor light emitting devices fabricated using InGaAlP-group materials usually have light reflecting layers, each composed of semiconductor multi-films, located above and under a light emitting layer formed on an n-type GaAs-substrate.

Light emitting diodes (LEDs), among such surface emission-type semiconductor light emitting devices, with no laser oscillation, are called resonant cavity LEDs. These resonant cavity LEDs are superior to usual LEDs with no resonant structure on monochromatic emission.

Surface emission-type semiconductor light emitting devices with laser oscillation are, for example, called a vertical cavity surface emitting laser that generates a large spot laser beam.

FIG. 1 is a sectional view showing a schematic structure of a well-known surface emission-type semiconductor light emitting device.

Stacked on an n-type GaAs-substrate 101 are an n-type GaAs-buffer layer 102, a multi-film light reflecting layer 103 made of n-type semiconductors, an n-type InGaAlP-clad layer 104, an InGaAlP-active layer 105, a p-type InGaAlP-clad layer 106, and a multi-film light reflecting layer 107 made of p-type semiconductors.

Formed on the clad layer 106 and also under the clad layer 104 are current blocking layers 108 that exhibit high resistance by selective oxidation.

A current flow between a front surface electrode 110 and an rear surface electrode 111 is confined onto an opening formed on the current blocking layers 108 for light emission. The emitted light is extracted through an opening formed on the front surface electrode 110.

FIG. 2 is a sectional view showing a schematic structure of another well-known surface emission-type semiconductor light emitting device.

Elements in this device that are the same as or analogous to elements in the former device (FIG. 1) are referenced by the same reference numbers and will not be explained in detail.

The device shown in FIG. 2 is provided with current blocking layers 109 that exhibit high resistance by proton ion implantation instead of selective oxidation.

The well-known surface emission-type semiconductor light emitting devices shown in FIGS. 1 and 2 have the following disadvantages:

The first disadvantage is caused by the multi-film light reflecting layer 107 made of p-type semiconductors formed over the active layer 105.

In the devices shown in FIGS. 1 and 2, a current flows through the light reflecting layer 107 formed over the active layer 105 in the vertical direction and lately confined by the current blocking layer 108. Electrical resistance of the light reflecting layer 107 is high in both vertical and horizontal directions.

Thus, these well-known devices have high series resistance and require a high operating voltage. Moreover, these devices exhibit insufficient temperature dependence characteristics depend on heat generation due to high resistance.

The second disadvantage is an extremely small margin of positioning of the openings of the current blocking layer 108 and the front surface electrode 110.

FIGS. 3A to 5B illustrate current flow and current distribution for the well-known surface emission-type semiconductor light emitting device.

As shown in FIG. 3A, when an opening diameter d2 of the current blocking layer 108 is extremely smaller than an opening diameter d1 of the front surface electrode 110 (d1>>d2), a current injected from the electrode 110 flows through the p-type light reflecting layer 107 in the lateral direction and hardly reaches the center portion of the opening of the current blocking layer 108.

As illustrated in FIG. 3B, the current mostly flows in the vicinity of the opening (d2) wall, thus exhibiting un-uniform emission distribution that deviates in the vicinity of the opening wall.

On the contrary, as shown in FIG. 4A, when an opening diameter d1 of the front surface electrode 110 is smaller than an opening diameter d2 of the current blocking layer 108 (d1<<d2), a current component that flows vertically from the front surface electrode 110 (the shortest passage) drastically increases.

As illustrated by a dot line in FIG. 4B, un-uniform emission distribution is exhibited that deviates in the vicinity of the opening wall. This emission is however blocked by the front surface electrode 110 and thus cannot be extracted. This results in un-uniform emission strength observed outside, as illustrated by a solid line.

Contrary to these devices, FIGS. 5A and 5B illustrate improvement in emission strength distribution. In detail, when an opening diameter d1 of the front surface electrode 110 is little bit larger than an opening diameter d2 of the current blocking layer 108 (d1>d2), a current injected from the surface electrode is diffused in a some extent in the vicinity of the center and the emission is extracted without being blocked by the front surface electrode 110.

In order to extract such uniform emission, however, the current blocking layer 108 and the front surface electrode 110 require precise fabrication so that an opening diameter d1 of the front surface electrode 110 is little bit larger than an opening diameter d2 of the current blocking layer 108 at a predetermined size.

It is difficult to control the selective oxidation in forming the current blocking layer 108 shown in FIG. 1. Thus, such a structure as shown in FIG. 5A is not always realized.

The other structure shown in FIG. 2 can be realized with precise dimension control by means of proton ion implantation for forming the current blocking layer 108. It is, however, difficult to form ohmic contact on the blocking layer 108. In detail, proton ion implanted on the light emitting surface side often causes deterioration of the semiconductor layer on the blocking layer 108. However, an arrangement such that the opening d1 of the front surface electrode 110 is made smaller than the opening d2 of the current blocking layer 10, to solve the problem, poses the problems discussed with reference to FIGS. 4A and 4B.

SUMMARY OF THE INVENTION

In order to solve the problems discussed above, a purpose of the present invention is to provide a surface emission-type semiconductor light emitting device that picks up uniform emission at high efficiency.

The present invention provides a semiconductor light emitting device including: a substrate made of a semiconductor of a first conductivity-type; a first light reflecting layer made of a semiconductor of the first conductivity-type and provided on a main surface of the substrate; an active layer made of a semiconductor including InGaAlP and provided on the first reflecting layer; a second light reflecting layer made of a semiconductor of a second conductivity-type and provided on the active layer; a current blocking layer having an opening, only through the opening a current flowing into the active layer; a transparent electrode provided on the second light reflecting layer; a front surface electrode provided on the transparent electrode and having an opening through which emission from the active layer is extracted; and a rear surface electrode provided on a rear surface of the substrate, wherein the current supplied by the transparent electrode located under the opening of the front surface electrode and flowing into the active layer through the opening of the current blocking layer causes the active layer to emit light, the light being reflected repeatedly between the first and the second light reflecting layers and extracted via the transparent electrode under the opening of the front surface electrode.

Moreover, the present invention provides a semiconductor light emitting device including: a substrate made of a semiconductor of a first conductivity-type; a first light reflecting layer made of a semiconductor of the first conductivity-type and provided on a main surface of the substrate; an active layer made of a semiconductor including InGaAlP and provided on the first light reflecting layer; a current blocking layer provided on the active layer and having an opening, only through the opening a current flowing into the active layer; a transparent electrode provided on the current blocking layer and over the active layer provided under the opening of the current blocking layer; a front surface electrode provided on the transparent electrode and having an opening through which emission from the active layer is picked up; a second light reflecting layer provided over the transparent electrode located under the opening of the front surface electrode; and a rear surface electrode provided on a rear surface of the substrate, wherein the current supplied by the transparent electrode located under the opening of the front surface electrode and flowing into the active layer through the opening of the current blocking layer causes the active layer to emit light, the light being extracted via the transparent electrode located under the opening of the front surface electrode and the second light reflecting layer.

Furthermore, the present invention provides a semiconductor light emitting device including: a substrate; a first light reflecting layer made of a semiconductor of a first conductivity-type and provided on a main surface of the substrate; a semiconductor layer made of a semiconductor of the first conductivity-type and provided on the first light reflecting layer; an active layer made of a semiconductor including InGaAlP and provided on a first portion of the semiconductor layer of the first conductivity-type; a current blocking layer provided on the active layer and having an opening, only through the opening a current flowing into the active layer; a transparent electrode provided on the current blocking layer and over the active layer provided under the opening of the current blocking layer; a first surface electrode provided on the transparent electrode and having an opening through which emission from the active layer is extracted; a second light reflecting layer provided over the transparent electrode located under the opening of the first surface electrode; and a second surface electrode provided on a second portion different from the first portion of the semiconductor layer of the first conductivity-type, wherein the current injected from the transparent electrode located under the opening of the front surface electrode and flowing into the active layer through the opening of the current blocking layer causes the active layer to emit light, the light being reflected repeatedly between the first and the second light reflecting layers.

In this invention, a semiconductor including InGaAlP represents any compound semiconductors in the III-V family expressed by the composition formula $In_xGa_yAl_xP$ ($0 \leq x \leq 1$, $0 \leq y \leq 1$, $0 \leq z \leq 1$ and $x+y+z=1$) that include p- or n-type dopant.

BRIEF DESCRIPTION OF DRAWINGS

FIGS. 3A and 3B are schematic illustrations of drive current distribution for a well-known surface emission-type semiconductor light emitting device, indicating that an opening diameter d2 of a current blocking layer 108 is extremely smaller than an opening diameter d1 of a surface electrode 110;

FIGS. 4A and 4B are schematic illustrations of drive current distribution indicating that an opening diameter d1 of a surface electrode 110 is smaller than an opening diameter d2 of a current blocking layer 108;

FIGS. 5A and 5B are schematic illustrations of improvement in emission strength distribution, indicating that an opening diameter d1 of the front surface electrode 110 is little bit larger than an opening diameter d2 of the current blocking layer 108 (d1>d2);

DETAILED DESCRIPTION OF PREFERRED EMBODIMENTS

Preferred embodiments according to the present invention will be disclosed with reference to the attached drawings.

(First Preferred Embodiment)

Figure 1:
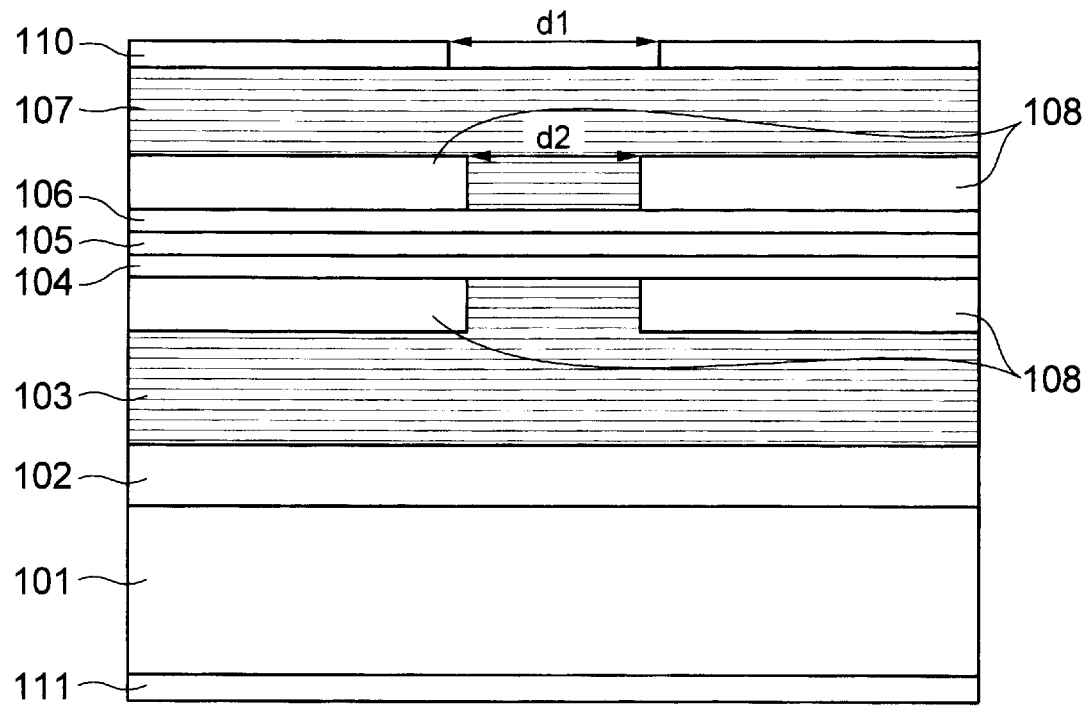
FIG. 1 is a sectional view showing a schematic structure of a well-known surface emission-type semiconductor light emitting device.
Figure 2:
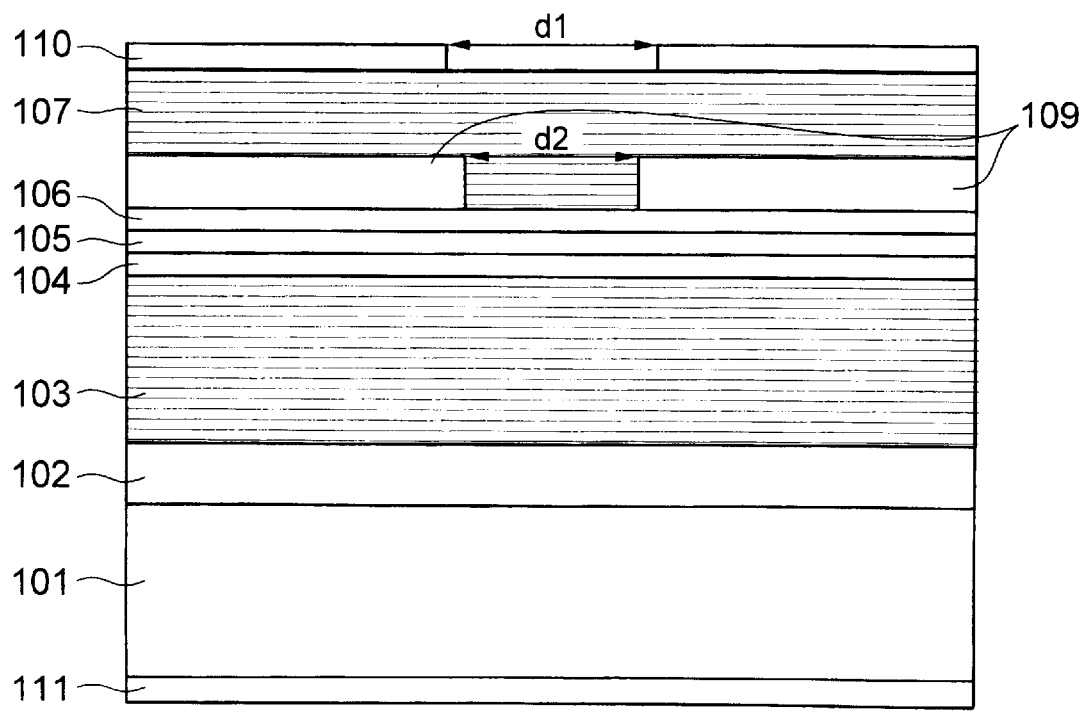
FIG. 2 is a sectional view showing a schematic structure of another well-known surface emission-type semiconductor light emitting device.
Figure 6:
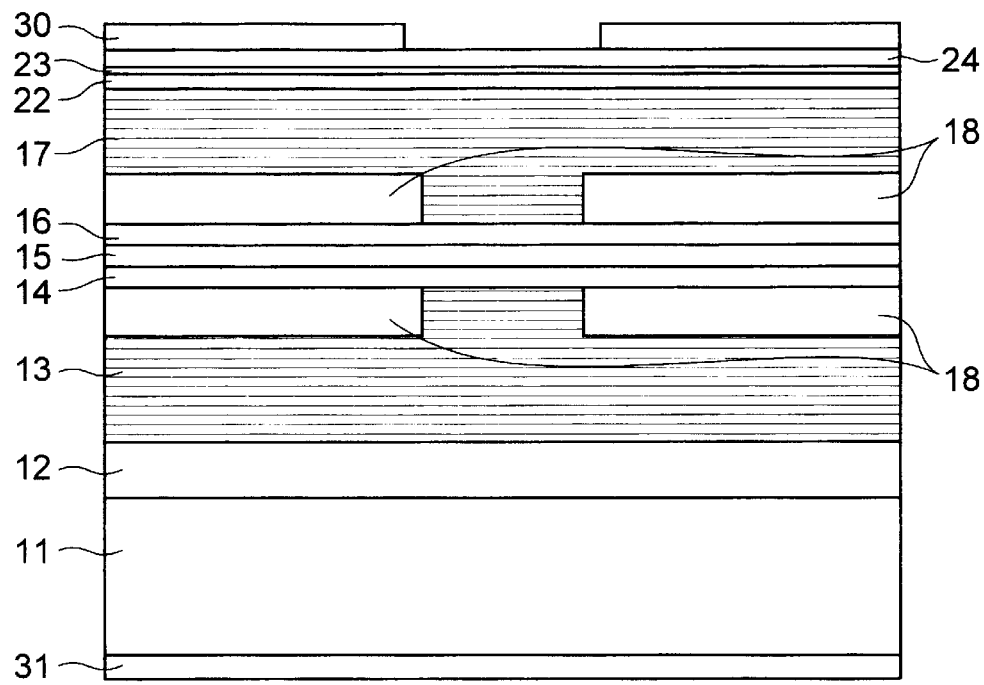
FIG. 6 is a sectional view showing a schematic structure of the first embodiment of a surface emission-type semiconductor light emitting device according to the present invention.

FIG. 6 is a sectional view showing a schematic structure of the first embodiment of a surface emission-type semiconductor light emitting device according to the present invention.

Stacked on an n-type GaAs-substrate 11 are an n-type GaAs-buffer layer 12, a multi-film light reflecting layer 13 made of n-type semiconductors, an n-type InGaAlP-clad layer 14, an InGaAlP-active layer 15, a p-type InGaAlP-clad layer 16, and a multi-film light reflecting layer 17 made of p-type semiconductors. The active layer 15 can be made of any semiconductor including InGaAlP.

Provided on the clad layer 16 and also under the clad layer 14 are current blocking layers 108 that have high resistance. Such high resistant layers are formed by selective oxidation in which at least either the multi-film light reflecting layer 13 or 17 is partially oxidized.

The multi-film light reflecting layers 13 and 17 are formed as a Bragg reflector by stacking, by turns, at least two types of semiconductor layers exhibiting different reflectivity. The layers 13 and 17 are composed, for example, of InAlP and InGaP layers, InAlP and InGaAlP layers, or GaAs and GaAlAs layers stacked.

Stacked on the multi-film light reflecting layer 17 are a p-type GaALAs-intermediate bandgap layer 22, a carbon-doped contact layer 23, and a transparent electrode 24.

Formed on the device surface through which light is picked up is a front surface electrode 30 having an opening. Moreover, a rear surface electrode 31 is formed on the rear surface of the device. The front and rear surface electrodes 30 and 31 are made of gold, for example.

In the device structure as disclosed above, the elements except the substrate 11 and the transparent electrode 24 are formed as epitaxial layers by metal organic chemical vapor deposition (MOCVD) using organic metals, such as, trimethyl gallium (TMG), trimethylalminium (TMA) and trimethylindium (TMI), and a hydride gas, such as, arsine ($AsH_3$) and phosphine ($PH_3$). The n-type semiconductor layer is formed with doping of impurity, such as silicon, with application of silane ($SiH_4$). The p-type semiconductor layer is formed with doping of impurity, such as zinc, with application of dimethylzine (DMZ). The intermediate bandgap layer 22 and the contact layer 23 are grown by doping of carbon with application of tetrabromocarbon ($CBr_4$). The composition of the active layer 15 is adjusted for a predetermined emission wavelength.

A growth temperature in the MOCVD-method as discussed above is 700° C., for example. After MOCVD-growth, a portion of each light reflecting layer is selectively oxidized, for example, by steam oxidation, to form the current blocking layers 18.

The transparent electrode 24 is formed using a material, such as, indium tin oxide (ITO), indium oxide, tin oxide and zinc oxide which is deposited by sputtering.

In the semiconductor light emitting device as disclosed above, a current supplied by the transparent electrode 24 under the opening of the front surface electrode 30 passes through the opening of the current blocking layer 18. The passing current flows to the InGaAlP-active layer only just under the opening of the current blocking layer 18 to emit light. The light is reflected between the multi-film light reflecting layer 13 (the first light reflecting layer) and the multi-film light reflecting layer 17 (the second light reflecting layer) repeatedly and extracted via the transparent electrode 24 under the opening of the front surface electrode 30.

Figure 7A:
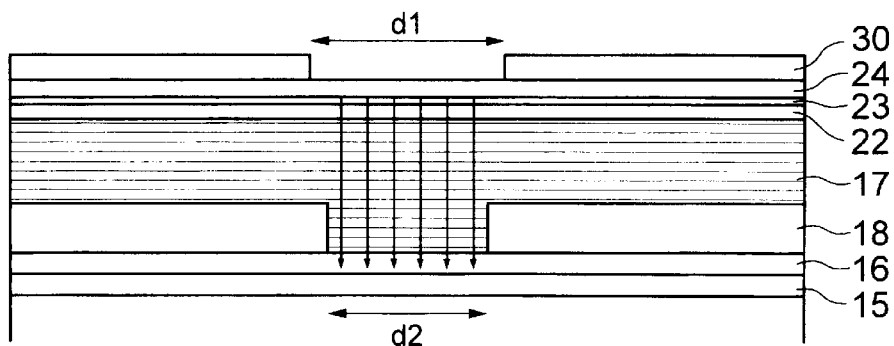
FIG. 7A illustrates current flow in the first embodiment of the light emitting device according to the present invention.
Figure 7B:
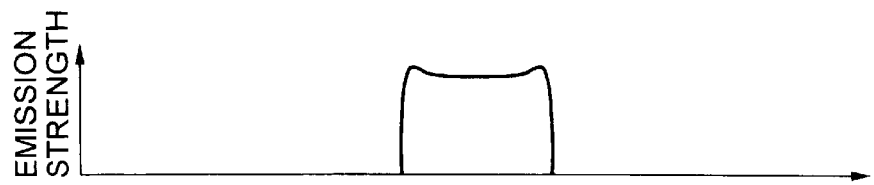
FIG. 7B is a graph representing emission strength distribution in the first embodiment of the light emitting device according to the present invention.

FIG. 7A illustrates current flow in the first embodiment of the light emitting device. FIG. 7B is a graph representing emission strength distribution in the first embodiment.

The transparent electrode 24 made of the material disclosed above having an adequate conductivity enables the present invention to have uniform current injection only to the InGaAlP-active layer 15 just under the opening of the front surface electrode 30, thus extracting emission of almost uniform distribution, as shown in FIG. 7B, at high efficiency.

Moreover, the present invention achieves almost uniform emission irrespective of the sizes d1 and d2 for the openings of the front surface electrode 30 and the current blocking layer 18, respectively, and their positional relationship, thus solving the problems for the well-known devices, as discussed with respect to FIGS. 1 to 5B.

In detail, in the light emitting device according to the present invention, an opening diameter d1 for the front surface electrode 24 larger than an opening diameter d2 for the current blocking layer 18 extracts emission generated by current injection at high efficiency with no blocking and also with posing no problems such as those discussed with reference to FIGS. 3A and 3B.

Moreover, according to the present invention, the carbon-doped contact layer 23 formed under the transparent electrode 24 drastically decreases contact resistance to the transparent electrode 24 made of an oxide such as ITO.

An adequately low contact resistance to a transparent electrode made of ITO, etc., requires high carrier concentration in the contact layer.

The inventor of this invention studied that an element in the II-family, such as, zinc (Zn), when doped as a p-type dopant at high concentration, is diffused into the active layer 15 and sometimes degrades emission performance.

Contrary to this, the present invention employs carbon as a p-type dopant, thus suppressing dopant diffusion to the active layer.

The inventor of the present invention studied advantages of carbon used as a p-type dopant to the contact layer 23, as discussed below.

Figure 8:
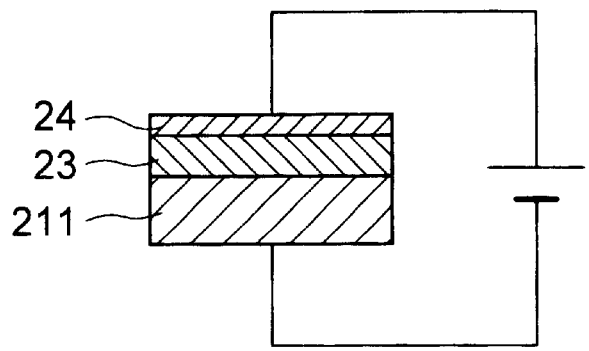
FIG. 8 shows a schematic structure of sample devices for evaluation fabricated by the inventor of the present invention.
Figure 9:
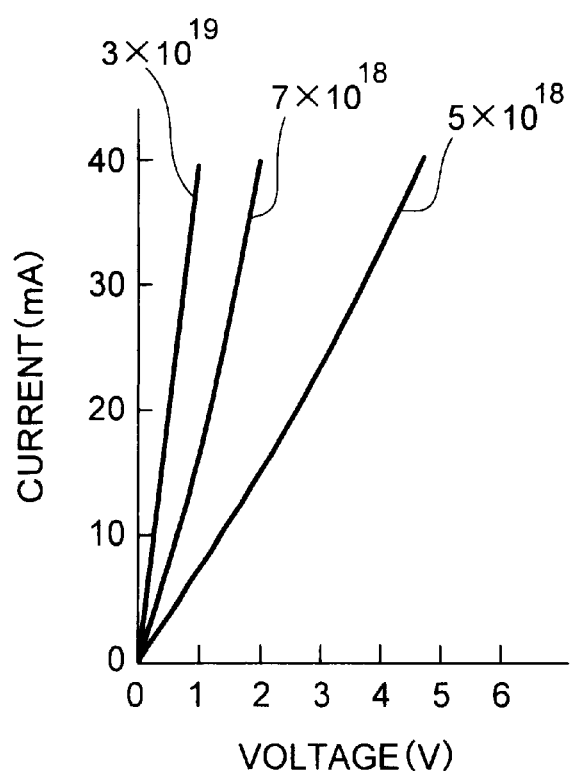
FIG. 9 is a graph representing a current-vs-voltage characteristics for the sample devices.

FIG. 8 shows a schematic structure of sample devices for evaluation. FIG. 9 is a graph representing a current-vs-voltage characteristics for the sample devices.

The sample devices had a stacked structure of a contact layer 23 and an ITO-electrode 24 on a p-type GaAs-substrate 211, as shown in FIG. 8. Three sample devices were fabricated for which amounts of carbon doped to the contact layer 23 were $5 \times 10^{18}$ cm$^{-3}$, $7 \times 10^{18}$ cm$^{-3}$ and $3 \times 10^{19}$ cm$^{-3}$, respectively. The p-type GaAs-substrate 211 was about 250 µm in thickness for the sample devices.

A voltage was applied to the sample devices in a reverse direction with respect to the contact of the ITO-electrode 23 and the contact layer 23. This voltage corresponds to a forward voltage to the light emitting device.

The sample devices revealed, as shown in FIG. 9, that the more the amount of carbon to be doped, the more abrupt decrease in device resistance, especially, the more the amount of carbon higher than about $1 \times 10^{19}$ cm$^{-3}$, the more the abrupt decrease in device resistance.

In other words, it was found that the amount of carbon to be doped at $1 \times 10^{19}$ cm$^{-3}$ or higher achieves abrupt reduction of the device resistance.

Moreover, the present invention employs the intermediate bandgap layer 22 having a bandgap intermediate between those of the light reflecting layer 17 and the contact layer 23, formed therebetween, that suppressing carrier piling-up which would otherwise happen due to discontinuity in valence band, and thus reducing device resistance.

Figure 10:
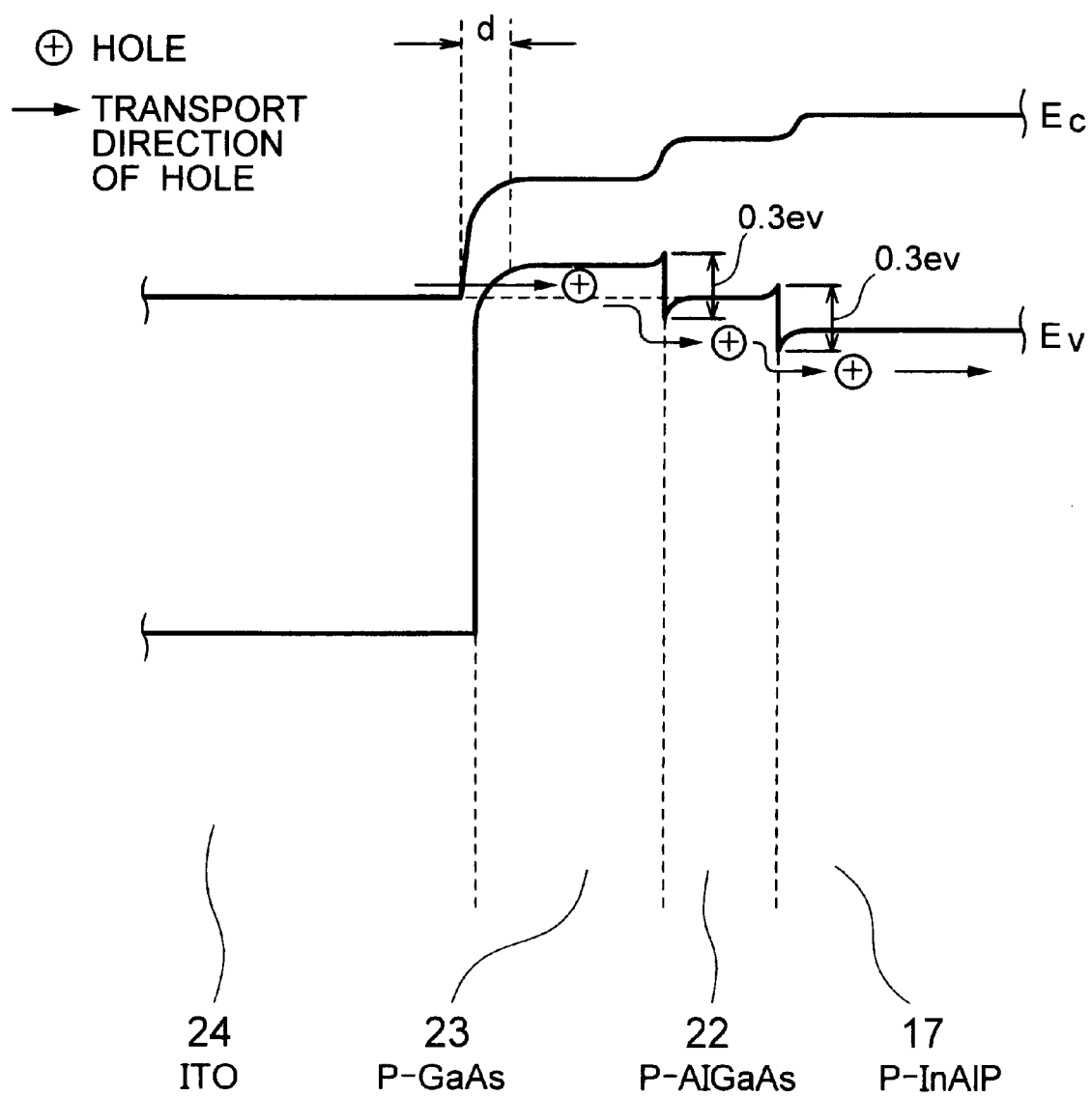
FIG. 10 illustrates a band structure in the vicinity of a transparent electrode of the light emitting device according to the present invention.

FIG. 10 illustrates a band structure in the vicinity of the transparent electrode of the light emitting device in the present invention.

As illustrated, there is about 0.6-eV difference in valence band energy Ev between the contact layer 23 for which carbon has been doped in large amount and the InAlP layer as a part of the p-type light reflecting layer 17. When both layers are joined to each other in this state, a high barrier will be formed on the interface therebetween due to discontinuity in valence band. This poses a problem in that a forward voltage applied to the transparent electrode will obstruct transport of holes, and thus increase resistance.

In order to solve such a problem, the present invention employs the intermediate bandgap layer 22 between the contact layer 23 and the light reflecting layer 17 as shown, having a bandgap that is intermediate between those of the layers 23 and 17. This structure reduces discontinuity in valence band to accelerate transport of holes, thus achieving reduction of device resistance.

It is preferable for the intermediate bandgap layer 22 made of $Ga_{1-x}Al_xAs$, a ratio of composition "x" for aluminium is in the range from 0.5 to 0.7 when the uppermost layer of the light reflecting layer 17 and the contact layer 23 are made of InAlP and GaAs, respectively. This composition range suppresses discontinuity to about 0.3 eV in valence bands formed on the interfaces between the InAlp layer 17 and the intermediate bandgap layer 22, and the layer 22 and the contact layer 23, thus obstructing piling-up of holes for reducing device resistance.

Moreover, it is preferable to use carbon as dopant for the intermediate bandgap layer 22 because it is hard to diffuse and it causes no deterioration of device characteristics like zinc. The amount of carbon as dopant is preferably $4 \times 10^{17}$ cm$^{-3}$ or more so as not to increase device resistance.

Disclosed next is a modification to the first embodiment.

Figure 11:
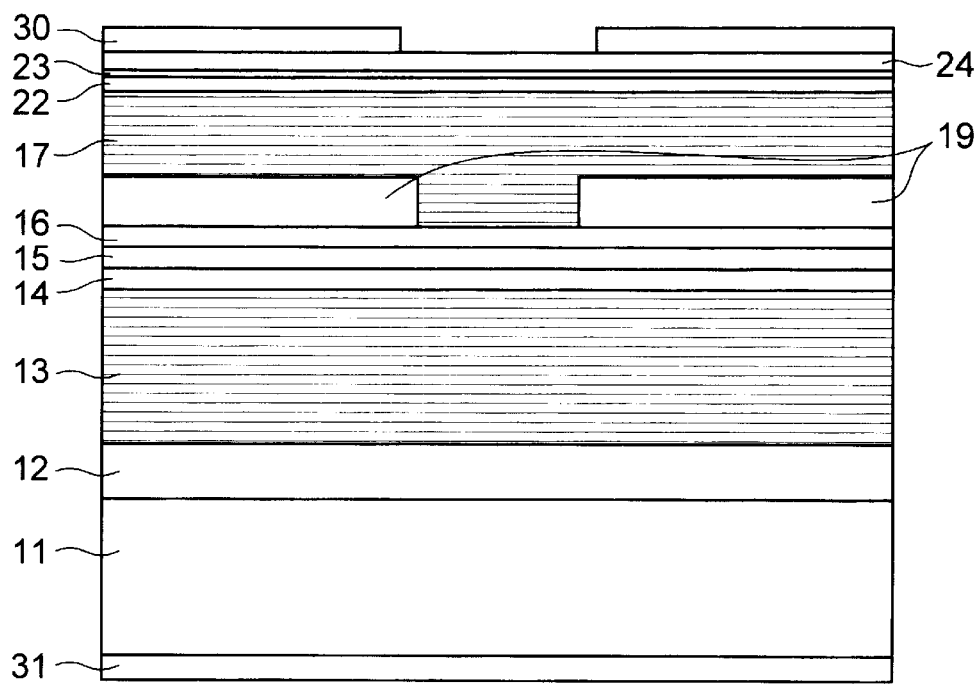
FIG. 11 is a sectional view showing a schematic structure of a modification to the first embodiment according to the present invention.

FIG. 11 is a sectional view showing a schematic structure of a modification to the first embodiment.

Elements in the modification that are the same as or analogous to elements in the first embodiment (FIG. 6) are referenced by the same reference numbers and will not be explained in detail.

A semiconductor light emitting device according to the modification is provided with a current blocking layer 19 formed by proton ion implantation. In detail, On the substrate 11, the component layers (the buffer layer 12 to the contact layer 23 that correspond to those shown in FIG. 6) are grown by MOCVP. following to this, proton ions are selectively implanted from the front surface to form the current blocking layer 19 exhibiting high resistance.

Figure 12A:
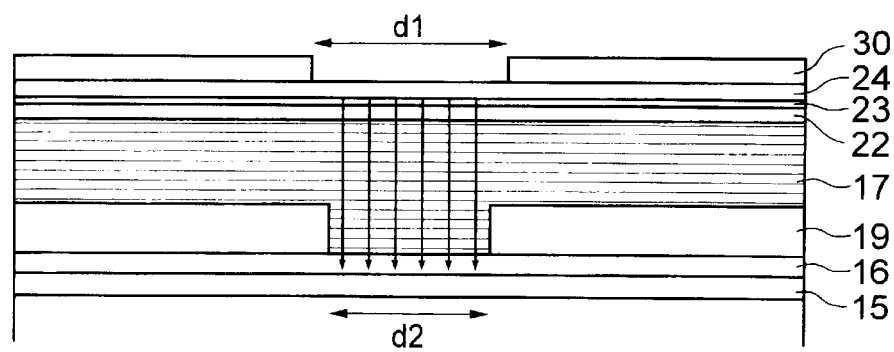
FIG. 12A is a schematic illustration of current flow in the light emitting device according to the present invention.
Figure 12B:
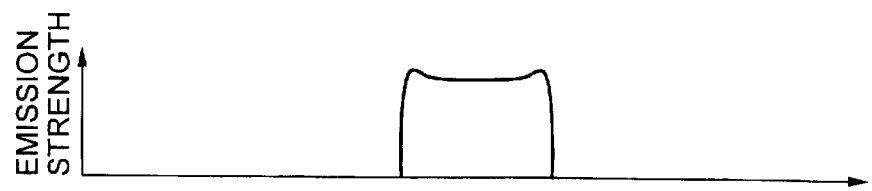
FIG. 12B is a graph representing emission strength distribution for the light emitting device according to the present invention.

FIG. 12A is a schematic illustration of current flow in the light emitting device according to the present invention. FIG. 12B is a graph representing emission strength distribution for the light emitting device according to the present invention.

The transparent electrode 24 enables this modification also to have uniform current injection only to the InGaAlP-active layer 15 just under the opening of the front surface electrode 30, thus extracting emission of almost uniform distribution at high efficiency.

Moreover, the carbon-doped contact layer 23 enables the modification to reduce contact resistance between the portion where proton ions have been implanted and the transparent electrode 24.

Furthermore, in the modification, implantation of proton ions to form the current blocking layer 19 offers precise control of opening shape for the layer 19, or device emission pattern.

(Second Preferred Embodiment)

Disclosed next is the second embodiment according to the present invention.

Figure 13:
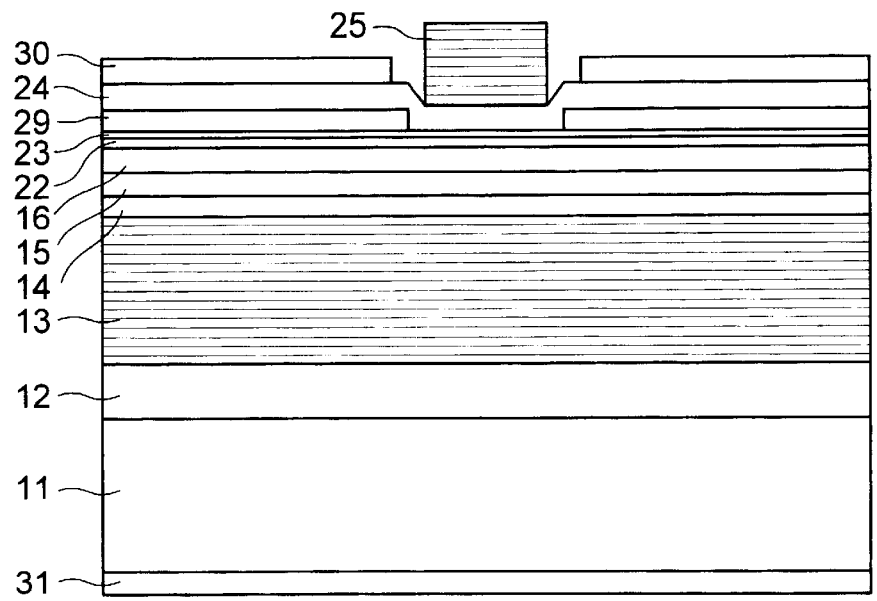
FIG. 13 is a sectional view showing a schematic structure of the second embodiment of a surface emission-type semiconductor light emitting device according to the present invention.

FIG. 13 is a sectional view showing a schematic structure of the second embodiment of a surface emission-type semiconductor light emitting device according to the present invention.

Elements in this embodiment that are the same as or analogous to elements disclosed with reference to FIGS. 6 to 12A are referenced by the same reference numbers and will not be explained in detail.

A light emitting device in the second embodiment is provided with a multi-film light emitting layer 25 made of p-type semiconductors and formed on the device front surface. In detail, on the active layer 15, the p-type clad layer 16, the intermediate bandgap layer 22 and the carbon-doped contact layer 23 are stacked in this order, and also thereon a current blocking layer 29 having an opening. Formed further on the layer 29 are the transparent electrode 24 and the front surface electrode 30 having an opening in which the light reflecting layer 25 is formed.

The multi-film light reflecting layer 25 is formed as a Bragg reflector by stacking, by turns, at least two types of dielectric layers exhibiting different reflectivity.

Figure 14A:
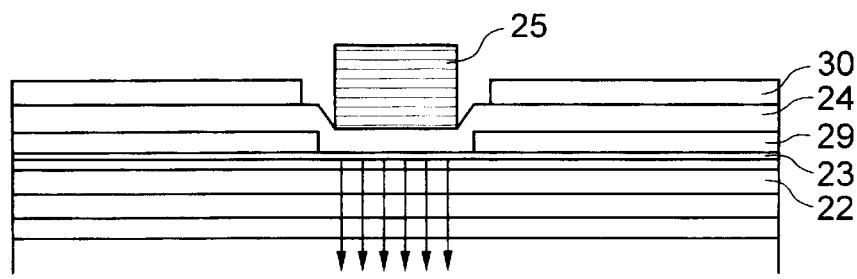
FIG. 14A is a schematic illustration of current flow in second embodiment of a light emitting device according to the present invention.
Figure 14B:
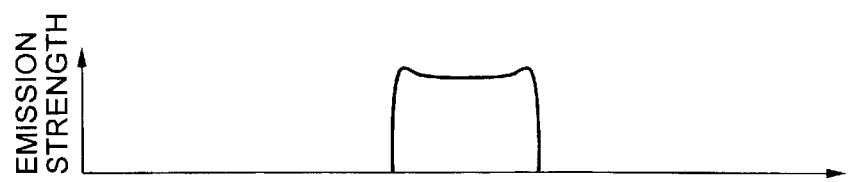
FIG. 14B is a graph representing emission strength distribution for the second embodiment of a semiconductor light emitting device according to the present invention.

FIG. 14A illustrates current flow in the second embodiment of the light emitting device. FIG. 14B is a graph representing emission strength distribution in the second embodiment.

The transparent electrode 24 enables the second embodiment also to have uniform current injection only to the InGaAlP-active layer 15 just under the opening of the current blocking layer 29, thus extracting emission of almost uniform distribution at high efficiency.

Moreover, the second embodiment having the light reflecting layer 25 formed on the transparent electrode 24 requires no light reflecting layer made of a p-type semiconductor, thus achieving drastic reduction of device resistance for lowering an operating voltage.

Furthermore, the second embodiment having the light reflecting layer 25 formed on the transparent electrode 24 requires no exitaxial growth of semiconductor, thus offering easy but precise formation of a reflecting layer exhibiting high reflectivity by combination of several types of dielectric materials, for example, a combination of $Tio_2$ and $SiO_2$ layers stacked by turns.

Moreover, the second embodiment having the current blocking layer 29 formed on the carbon-doped contact layer 23 does not require exitaxial growth of semiconductor and also selective oxidation and proton ion implantation. Employing materials of high resistance, such as $SiO_2$ and SiN, instead, offers an effect of current blocking easily and precisely.

(Third Preferred Embodiment)

Disclosed next is the third embodiment according to the present invention.

Figure 15:
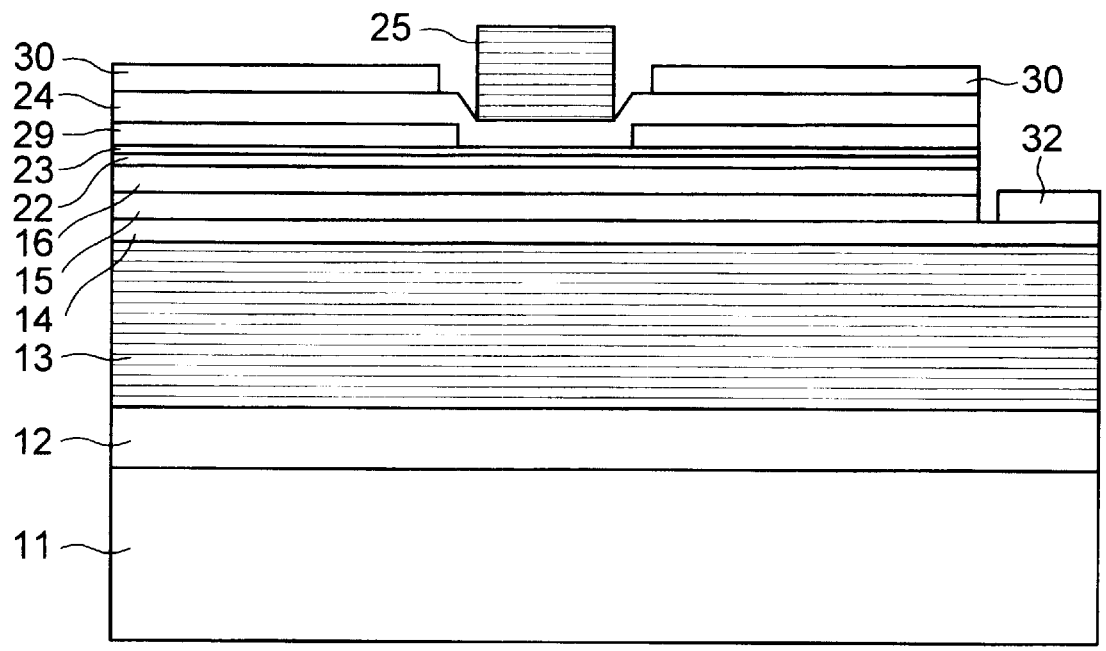
FIG. 15 is a sectional view showing a schematic structure of the third embodiment of a surface emission-type semiconductor light emitting device according to the present invention.

FIG. 15 is a sectional view showing a schematic structure of the third embodiment of a surface emission-type semiconductor light emitting device according to the present invention.

Elements in this embodiment that are the same as or analogous to elements disclosed with reference to FIGS. 6 to 14A are referenced by the same reference numbers and will not be explained in detail.

In the third embodiment, the n-type clad layer 14 is partially exposed over the device surface with an n-type electrode 32 on the exposed surface.

The third embodiment also has the advantages the same as those discussed in the second embodiment.

Moreover, in the third embodiment, a current supplied by the n-type electrode 32 is spread into the n-type clad layer 14 in the lateral direction and then flows through the transparent electrode 24 in the vertical direction through the opening of the current blocking layer 29. In other words, the light reflecting layer 13 does not intercept the current passage also at "n" polarity-side of the active layer 15, thus achieving further reduction of device resistance for lowering an operating voltage.

Although not shown, in addition to the device of FIG. 15, it is preferable that a n-type contact layer of low resistance is formed under the n-type clad layer 14 and partially exposed to have the n-type electrode 32 on the exposed surface, thus achieving further reduction of contact resistance in the "n" polarity-side and the device resistance.

(Fourth Preferred Embodiment)

Disclosed next is the fourth embodiment according to the present invention.

Figure 16:
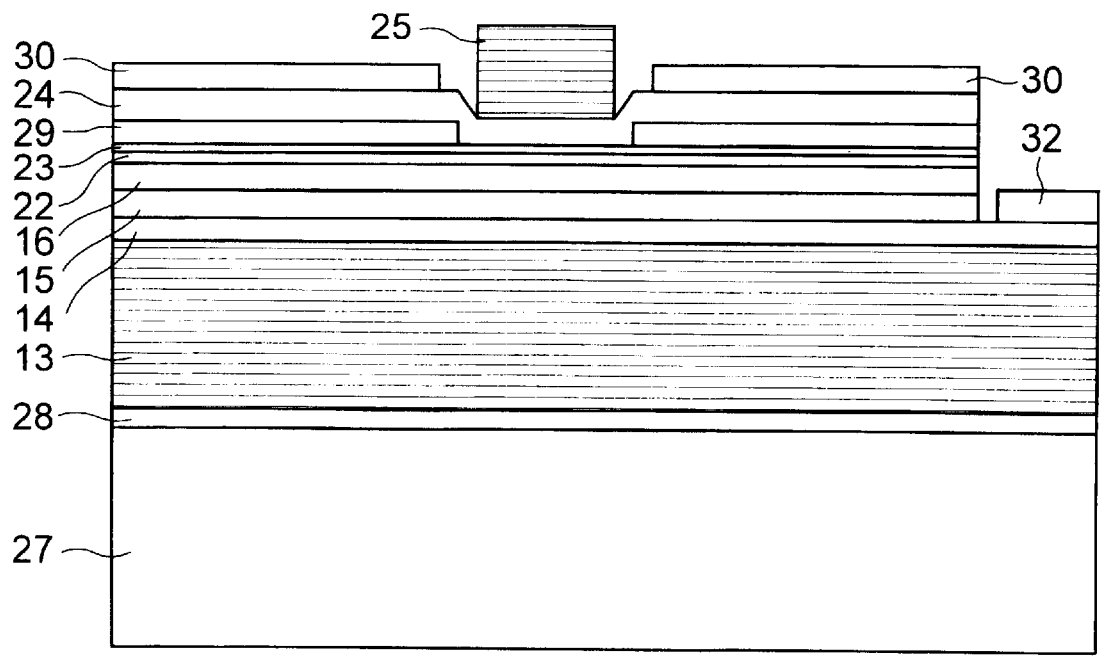
FIG. 16 is a sectional view showing a schematic structure of the fourth embodiment of a surface emission-type semiconductor light emitting device according to the present invention.

FIG. 16 is a sectional view showing a schematic structure of the fourth embodiment of a surface emission-type semiconductor light emitting device according to the present invention.

Elements in this embodiment that are the same as or analogous to elements disclosed with reference to FIGS. 6 to 15 are referenced by the same reference numbers and will not be explained in detail.

The fourth embodiment is provided with an InGaAlP-bonding layer 28 on a GaP-substrate 27 with the device region the same as that for the third embodiment.

In this embodiment, light emitted from the active layer 15 is extracted through the rear surface via the GaP-substrate 27.

Fabrication steps for the light emitting device in the fourth embodiment are as follows:

On a GaAs-substrate (not shown), a GaAs buffer layer, the n-type semiconductor multi-film light reflecting layer 13 and the InGaAlP-bonding layer 18 are grown in this order.

The GaP-substrate 27 is bonded on the surface of the boning layer 18 by, for example, making contact the substrate 27 and the layer 18 in an atmosphere of hydrogen with pressing and heating to join each other, followed by removing the GaAs-substrate and the GaAs-buffer layer by etching.

Next, on the light reflecting layer 13, the device components layers (the n-type clad layer 14 to the carbon-doped contact layer 23 the same as those for the former embodiment) are grown, followed by selective etching of a portion from the front surface to partially expose the n-type clad layer 14.

Moreover, the current blocking layer 29, the transparent electrode 24, the front surface electrode 30, the light reflecting layer 25 and the n-type electrode 32 are formed to complete the device.

The fourth embodiment also has advantages discussed in the first to the third embodiments.

Furthermore, the fourth embodiment employs the GaP-substrate 27 transparent to a wavelength of emission from the active layer 15, thus picking up emission outside via the substrate 27.

Flip-chip mounting for mounting the device on a circuit board (not shown), etc., is therefore possible from the device front surface, thus makes device compactness, lightness, high performance, high reliability, and so on for any apparatus using the light emitting device according to the present invention.

In the second to the fourth embodiments, the current blocking layer may include silicon oxide or silicon dioxide as a major component.

As disclosed above, according to the present invention, the light emitting device is provided with a transparent electrode exhibiting an adequate conductivity to inject a uniform current in the vertical direction of the device under the opening of the front surface electrode. The light emitting device in the present invention thus extracts emission of almost uniform distribution.

Moreover, according to the present invention, the light emitting device pick up outside emission of almost uniform distribution with no respect to the size of the openings of the front surface electrode and the current blocking layer and also their positional relationship.

Especially, the opening of the front surface electrode formed as larger than that of the current blocking layer does not cause any problems discussed with reference to FIG. 14. The light emitting device thus can extract at high efficiency with no blocking of the emission by the front surface electrode.

Moreover, according to the present invention, the carbon-doped contact layer formed under the transparent electrode drastically decreases contact resistance to the transparent electrode of an oxide such as ITO. The contact layer further does not cause degradation of the emission characteristics, which would otherwise occur when the contact layer is made of zinc, etc.

Moreover, the present invention employs the intermediate bandgap layer having a bandgap intermediate between those of the light reflecting layer and the contact layer, formed therebetween. The bandgap layer can suppress carrier piling-up which would otherwise happen due to discontinuity in valence band, thus achieving reduction of device resistance.

Furthermore, according to the light emitting device of the present invention, the light reflecting layer is formed on the transparent electrode. This structure requires no exitaxial growth of semiconductor, thus offering easy but precise formation of a reflecting layer exhibiting high reflectivity by combination of several types of dielectric materials, for example, a combination of $Tio_2$ and $SiO_2$ layers stacked by turns.

Moreover, according to the light emitting device of the present invention, the current blocking layer is also formed on the contact layer. This structure does not require exitaxial growth of semiconductor and also selective oxidation and proton ion implantation. Employing materials of high resistance, such as $SiO_2$ and SiN, offers an effect of current blocking easily and precisely.

As disclosed above, the present invention offers a light emitting device including InGaAlP-semiconductors having low device resistance, thus exhibiting excellent emission characteristics and long duration of life, which brings a big advantage to the industry.

What is claimed is:

1. A semiconductor light emitting device comprising:
a substrate made of a semiconductor of a first conductivity-type;
a first light reflecting layer made of a semiconductor of the first conductivity-type and provided on a main surface of the substrate;
an active layer made of a semiconductor including InGaAlP and provided on the first reflecting layer;
a second light reflecting layer made of a semiconductor of a second conductivity-type and provided on the active layer;
a current blocking layer having an opening, only through the opening a current flowing into the active layer;
a transparent electrode provided on the second light reflecting layer;
a front surface electrode provided on the transparent electrode and having an opening through which emission from the active layer is extracted; and
a rear surface electrode provided on a rear surface of the substrate,
wherein the current supplied by the transparent electrode located under the opening of the front surface electrode and flowing into the active layer through the opening of the current blocking layer causes the active layer to emit light, the light being reflected repeatedly between the first and the second light reflecting layers and extracted via the transparent electrode under the opening of the front surface electrode.

2. The semiconductor light emitting device according to claim 1, the current blocking layer is formed by partially oxidizing at least either the first or the second light reflecting layer.

3. The semiconductor light emitting device according to claim 1, the current blocking layer is formed by implanting proton ions into a portion of the second light reflecting layer.

4. The semiconductor light emitting device according to claim 1 further comprising a contact layer made of a semiconductor including carbon, the contact layer being made contact with the transparent electrode between the active layer and the transparent layer.

5. The semiconductor light emitting device according to claim 4, wherein the contact layer includes the carbon at $1 \times 10^{19}$ $cm^{-3}$ or more.

6. The semiconductor light emitting device according to claim 4 further comprising an intermediate bandgap layer provided between the contact layer and the active layer, the bandgap layer having a bandgap larger than a bandgap of the contact layer but smaller than a bandgap of the a semiconductor layer located in the vicinity of th e active layer.

7. The semiconductor light emitting device according to claim 1, wherein the second light reflecting layer is a multi-film light reflecting layer having the uppermost layer made of InAlp, the contact layer being made of GaAs, the intermediate bandgap layer and the contact layer being stacked between the second reflecting layer and the transparent layer, the intermediate bandgap layer being made of $Ga_{1-x}Al_xAs$, a ratio of composition "x" for aluminium being in the range from 0.5 to 0.7.

8. The semiconductor light emitting device according to claim 7, wherein the intermediate bandgap layer includes carbon at $4 \times 10^{17}$ $cm^{-3}$ or more.

9. A semiconductor light emitting device comprising:
a substrate made of a semiconductor of a first conductivity-type;
a first light reflecting layer made of a semiconductor of the first conductivity-type and provided on a main surface of the substrate;
an active layer made of a semiconductor including InGaAlP and provided on the first light reflecting layer;
a current blocking layer provided on the active layer and having an opening, only through the opening a current flowing into the active layer;
a transparent electrode provided on the current blocking layer and over the active layer provided under the opening of the current blocking layer
a front surface electrode provided on the transparent electrode and having an opening through which emission from the active layer is picked up;
a second light reflecting layer provided over the transparent electrode located under the opening of the front surface electrode; and
a rear surface electrode provided on a rear surface of the substrate,
wherein the current injected from the transparent electrode located under the opening of the front surface electrode and flowing into the active layer through the opening of the current blocking layer causes the active layer to emit light, the light extracted via the transparent electrode located under the opening of the front surface electrode and the second light reflecting layer.

10. The semiconductor light emitting device according to claim 9, wherein the current blocking layer includes either silicon oxide or silicon dioxide as a major component.

11. The semiconductor light emitting device according to claim 9, wherein the second light reflecting layer includes dielectric layers of at least two different types stacked by turns.

12. The semiconductor light emitting device according to claim 9 further comprising a contact layer made of a semiconductor including carbon, the contact layer being made contact with the transparent electrode between the active layer and the transparent electrode.

13. The semiconductor light emitting device according to claim 12, wherein the contact layer includes the carbon at $1 \times 10^{19}$ $cm^{-3}$ or more.

14. The semiconductor light emitting device according to claim 12 further comprising an intermediate bandgap layer provided between the contact layer and the active layer, the bandgap layer having a bandgap larger than a bandgap of the contact layer but smaller than a bandgap of the a semiconductor layer located in the vicinity of the active layer.

15. A semiconductor light emitting device comprising:

a substrate;

a first light reflecting layer made of a semiconductor of a first conductivity-type and provided on a main surface of the substrate;

a semiconductor layer made of a semiconductor of the first conductivity-type and provided on the first light reflecting layer;

an active layer made of a semiconductor including InGaAlP and provided on a first portion of the semiconductor layer of the first conductivity-type;

a current blocking layer provided on the active layer and having an opening, only through the opening a current flowing into the active layer;

a transparent electrode provided on the current blocking layer and over the active layer provided under the opening of the current blocking layer;

a first surface electrode provided on the transparent electrode and having an opening through which emission from the active layer is picked up;

a second light reflecting layer provided over the transparent electrode located under the opening of the first surface electrode; and a second surface electrode provided on a second portion different from the first portion of the semiconductor layer of the first conductivity-type, wherein the current injected from the transparent electrode located under the opening of the front surface electrode and flowing into the active layer through the opening of the current blocking layer causes the active layer to emit light, the light being reflected repeatedly between the first and the second light reflecting layers.

16. The semiconductor light emitting device according to claim 15 further comprising a contact layer of the first conductivity-type provided between the first light reflecting layer and the semiconductor layer of the first conductivity type, the second surface electrode being provided on the second portion on the contact layer of the first conductivity-type.

17. The semiconductor light emitting device according to claim 15, wherein the repeatedly reflected light is extracted via the second reflecting layer.

18. The semiconductor light emitting device according to claim 15, wherein the repeatedly reflected light is extracted via the substrate.

19. The semiconductor light emitting device according to claim 15, wherein the current blocking layer includes either silicon oxide or silicon dioxide as a major component.

20. The semiconductor light emitting device according to claim 15, wherein the second reflecting layer includes dielectric layers of at least two different types stacked by turns.

21. The semiconductor light emitting device according to claim 15 further comprising a contact layer made of a semiconductor including carbon, the contact layer being made contact with the transparent electrode between the active layer and the transparent electrode.

22. The semiconductor light emitting device according to claim 21, wherein the contact layer includes the carbon at $1 \times 10^{19}$ cm$^{-3}$ or more.

23. The semiconductor light emitting device according to claim 21 further comprising an intermediate bandgap layer provided between the contact layer and the active layer, the bandgap layer having a bandgap larger than a bandgap of the contact layer but smaller than a bandgap of the a semiconductor layer located in the vicinity of the active layer.

* * * * *